(12) United States Patent
Prabhakar et al.

(10) Patent No.: US 8,576,633 B2
(45) Date of Patent: Nov. 5, 2013

(54) 1T SMART WRITE

(75) Inventors: Venkatraman Prabhakar, Pleasanton, CA (US); Frederick Jenne, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 68 days.

(21) Appl. No.: 13/248,241

(22) Filed: Sep. 29, 2011

(65) Prior Publication Data

US 2013/0083608 A1    Apr. 4, 2013

(51) Int. Cl.
*G11C 11/34*    (2006.01)

(52) U.S. Cl.
USPC ................................ 365/185.24; 365/185.02

(58) Field of Classification Search
USPC ........................................ 365/185.02, 185.24
See application file for complete search history.

(56) References Cited

U.S. PATENT DOCUMENTS

| | | | |
|---|---|---|---|
| 2008/0089133 A1* | 4/2008 | Ito ............................. | 365/185.22 |
| 2009/0010068 A1* | 1/2009 | Lee ........................... | 365/185.19 |
| 2010/0195397 A1* | 8/2010 | Hemink ................... | 365/185.17 |

* cited by examiner

*Primary Examiner* — Michael Tran

(57) ABSTRACT

The threshold voltages of particular nonvolatile memory cells on a word line are selectively increased on a column by column (cell by cell) basis. A selective program is performed on some of the cells, and simultaneously a program inhibit on other of the cells, resulting in all of the cells having a threshold voltage that falls between a minimum acceptable value and a maximum acceptable value.

19 Claims, 13 Drawing Sheets

Test Flow 1

Bulk Erase: -10.5V 6ms

Bulk Soft Program: 7V 120us

Selectively Soft Program/Inhibit: 7V 120us

Repeat Step 3 Until All VT > -1.1V

Program Inhibit (Data): 10V 2ms

Test Flow 2

Bulk Erase: -10.5V 6ms

Program Inhibit (Data):10V 2ms

Selectively Soft Program/Inhibit: 7V 120us

Fail    Pass

Repeat Step 3 Until All VT > -1.1V

1T SMART WRITE

BACKGROUND

Two transistor silicon-oxide-nitride-oxide-silicon memory devices ("2T SONOS") can tolerate a greater variation in the erase threshold voltage (Vt) distribution of individual memory cells, due to the use of an additional select transistor. It is not necessary to adjust the erase threshold voltages on a column by column basis in such devices. However, the erase threshold voltage distribution is not tight enough to make a one transistor ("1T SONOS") device functional. Due to a large variation of SONOS device characteristics within a given memory row, existing techniques do not significantly tighten the distribution of erase threshold voltages within a sector. For many advanced technologies (130 nm and below), random dopant fluctuation is a significant source of Vt variation. For these technologies, the Vt distribution within a WL is naturally very broad—and in fact can be almost as broad as the distribution of Vt within the full chip.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

An embodiment of a single-transistor SONOS memory cell array is illustrated in FIG. 1.

DETAILED DESCRIPTION

Preliminaries

Figure 1:
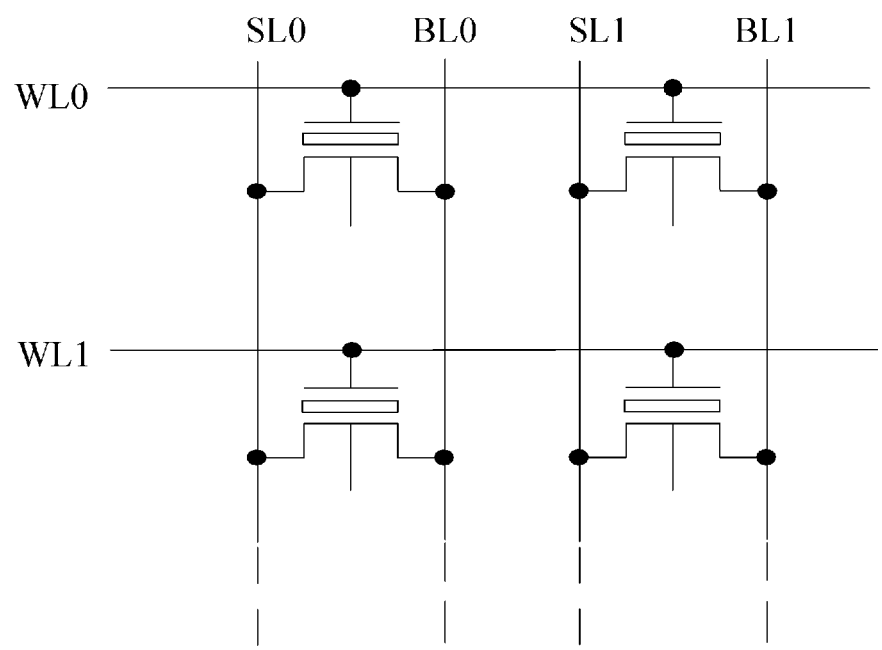

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other.

"Logic" refers to machine memory circuits, machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein. The techniques and procedures described herein may be implemented via logic distributed in one or more devices. The particular distribution and choice of logic is a design decision that will vary according to implementation.

Limit terms such as "target", "threshold", "minimum", "maximum" as applied herein to voltage/signal levels, do not refer to absolute values, but instead to values within a range on either side of the specified limit. In other words, limit values will necessarily tolerate certain variations and fluctuations within tolerances of the particular design, and these tolerances will be readily apparent to those skilled in the art applying the techniques and designs disclosed herein.

The term "modulated" as applied to soft program cycles means that a value, either the voltage level or time interval of the soft program operation, is varied between cycles responsive to some control variable(s), such as but not limited to a number of the present cycle. The term "change" may also be used, and should be given the same meaning.

The term "cell by cell basis" means that a process can be selectively applied to individual memory cells on a same word line.

Process examples and memories are provided herein using SONOS transistors. However, the processes described are not limited to SONOS technology, and may be applied to other memory transistor technologies such as floating gate, with variation to certain process parameters such as the example voltage levels/intervals readily ascertainable to those of skill in the art.

Overview

SONOS (silicon-oxide-nitride-oxide-silicon) is a nonvolatile, trapped-charge semiconductor memory technology that provides several advantages over conventional floating-gate flash memories, including immunity from single point failures and programming at lower voltages. In contrast to floating-gate devices, which store charge on a conductive gate, SONOS devices trap charge in a dielectric layer. SONOS transistors are programmed and erased using a quantum mechanical effect known as Modified Fowler-Nordheim tunneling. A SONOS transistor is an insulated-gate field effect transistor (IGFET) with additional dielectric layers between a conventional control gate and a channel in the body or substrate of the transistor. The dielectric layers include a thin tunneling layer above the channel, a charge-trapping layer above the tunneling layer and a blocking layer between the charge-trapping layer and the control gate. A SONOS transistor can be fabricated as a P-type or N-type IGFET using CMOS (complementary metal-oxide-semiconductor) fabrications methods.

A SONOS transistor is programmed or erased by applying a voltage of the proper polarity, magnitude and duration between the control gate and the substrate. A positive gate-to-substrate voltage causes electrons to tunnel from the channel to charge charge-trapping dielectric layer and a negative gate-to-channel voltage causes holes to tunnel from the channel to the charge-trapping dielectric layer. In one case, the threshold voltage of the transistor is raised and in the other case, the threshold voltage of the transistor is lowered. The threshold voltage is the gate-to-source voltage that causes the transistor to conduct current when a voltage is applied between the drain and source terminals. For a given amount of trapped charge, the direction of the threshold voltage change depends on whether the transistor is an N-type or P-type FET.

A typical N-type SONOS transistor has a programming voltage of approximately +10 volts and an erase voltage of approximately −10 volts. After application of these voltages to the SONOS for approximately 10 milliseconds, the programmed threshold voltage is greater than +1 volt and the erased threshold is less than −1 volt. After a programming or erase operation is completed, the state of the SONOS can be read by setting the gate-to-source voltage to zero, applying a small voltage between the drain and source terminals and sensing the current that flows through the transistor. In the programmed state, the N-type SONOS transistor will be OFF because the gate-to-source voltage will be below the programmed threshold voltage $V_{TP}$. In the erased state, the N-type SONOS transistor will be ON because the gate-to-source voltage will be above the erased threshold voltage $V_{TE}$. Conventionally, the ON state is associated with a logical "0" and the OFF state is associated with a logical "1", but the choice is a matter of design.

The erase threshold voltage of a SONOS saturates if the duration of the erase pulse width exceeds a given time, for example 10 milliseconds. This condition occurs because the hole injection current from the substrate into the memory layer and the back streaming of injected electron current from the gate into the memory layer are equal resulting in no net charge increase or decrease. In this state, the local electric field of the positive charge can induce hot electron back-streaming (e.g., from the gate side) that can damage the memory dielectric layers. The damage produces trapping sites in the memory dielectric layers that increases charge leakage (via trap assisted tunneling) and reduces the data retention.

An over-erased condition can be reached via an accumulation of shorter erase pulses in a conventionally operated SONOS memory system. An embodiment of a single-transistor SONOS memory cell array is illustrated in FIG. 1. Each cell comprises a SONOS memory transistor that shares a common substrate connection with other cells in the memory array. The gates of the SONOS transistors is a given row are connected to a word line (WL). The cells in a given column are coupled to a common a source line (SL) and a common bit line (BL).

Conventionally, a write operation on a row in a SONOS array is conducted in two steps, or cycles, where a bulk erase (BE) operation is performed on all the cells in the row and then followed a program or inhibit operation on individual cells depending on the data that is being written. The bulk erase is accomplished (for N-type SONOS devices) by applying a negative pulse voltage WL, and a positive pulse voltage on SL, BL, and the common substrate connection. This has the effect of writing a "0" to every cell in the row. Next, the positive and negative voltages on the gates and substrate are reversed. The SL and BL connections of cells that are to be written to a "1" are also reversed so that the cells are exposed to the full voltage of the programming pulse. Cells that are to be written to a "0" are inhibited from programming (because they are already in a "0" state by virtue of the bulk erase) by the application of a positive inhibiting voltage on their SL and BL connections. The inhibiting voltage reduces the electric field across the tunneling layer when the programming pulse is applied, reducing the tunneling of electrons to the charge trapping layer.

This conventional, 2-cycle write operation can generate an over-erase condition in cells that are written to "0" on multiple consecutive writes. In addition, over-erased cells may also occur on a single write when the intrinsic variation of the SONOS erased Vt is large. Over-erased cells can experience excessive stored charge leakage onto SL and/or BL. A "soft program" may be applied to over-erased cells to reduce leakage, while maintaining an acceptable read current margin window by tightening up the erase threshold. Soft programming is useful in part because non-overerased cells are not undesirably programmed. In one embodiment, soft programming is accomplished by applying a relatively low gate voltage, of approximately 6 to 7 volts, to the memory cells. As a result, over-erased cells are corrected, and non-overerased memory cells are not undesirably programmed, or disturbed, because the relatively lower gate voltage in addition to the relatively low floating gate voltage of the non-overerased cell are insufficient to draw hot electrons into the floating gates of the non-overerased memory cells.

Figure 2:
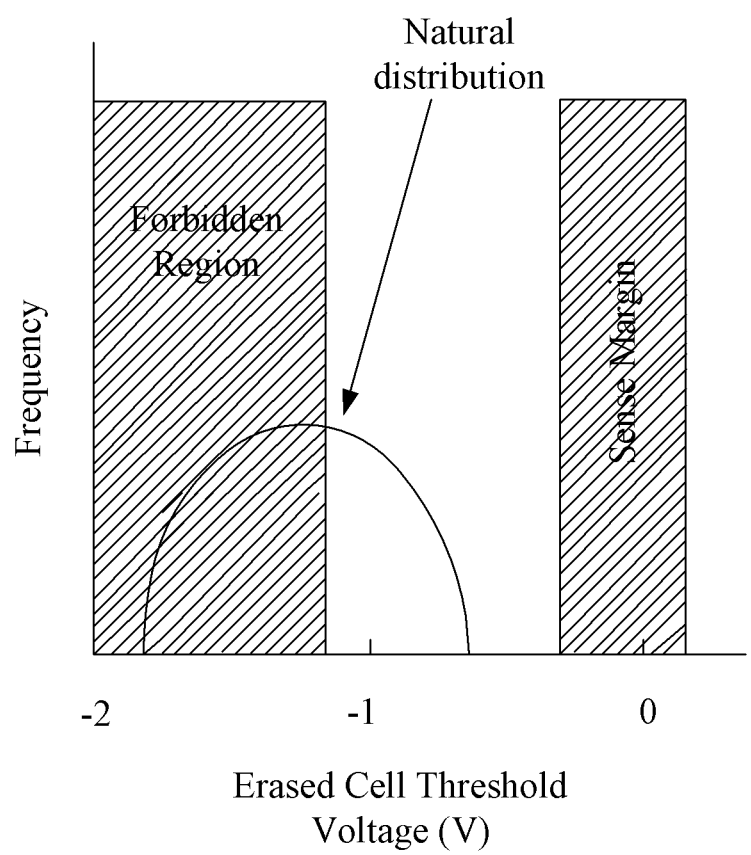
FIG. 2 illustrates a situation in which, following a bulk erase operation, the erase thresholds of SONOS transistors have a natural threshold voltage distribution that extends into the forbidden region of more negative than −1.2V
Figure 3:
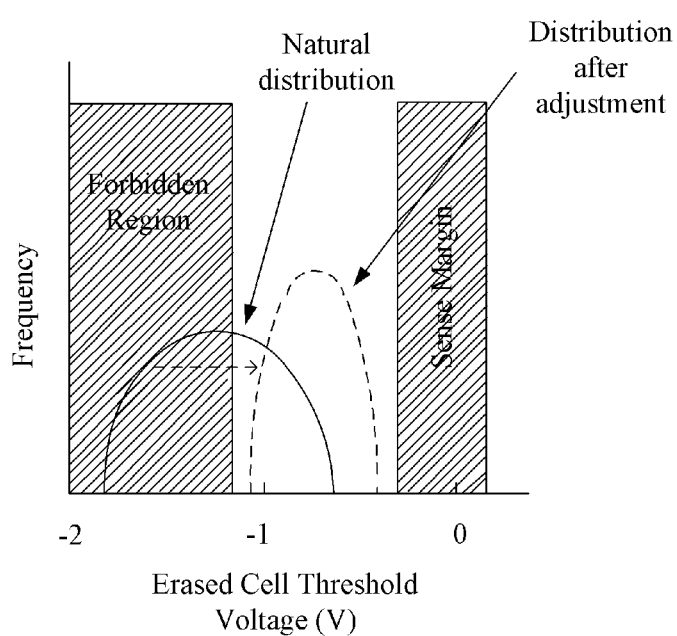
FIG. 3 illustrates the same cells after application of an erased cell threshold adjustment process.

FIG. 2 illustrates a situation in which, following a bulk erase operation, the erase thresholds of SONOS transistors have a natural threshold voltage distribution that extends into a forbidden region of more negative than −1.2V. These over-erased cells will experience excessive charge leakage, potentially resulting in device failure. FIG. 3 illustrates the same cells after application of an erased cell threshold adjustment process, embodiments of which are herein described. The natural threshold distribution is tightened up and shifted into the desired limits between the forbidden region and the sense margin window. Both un-selected WL leakage current and selected WL read current requirements are met by cells having threshold voltages within the acceptable window.

Figure 4:
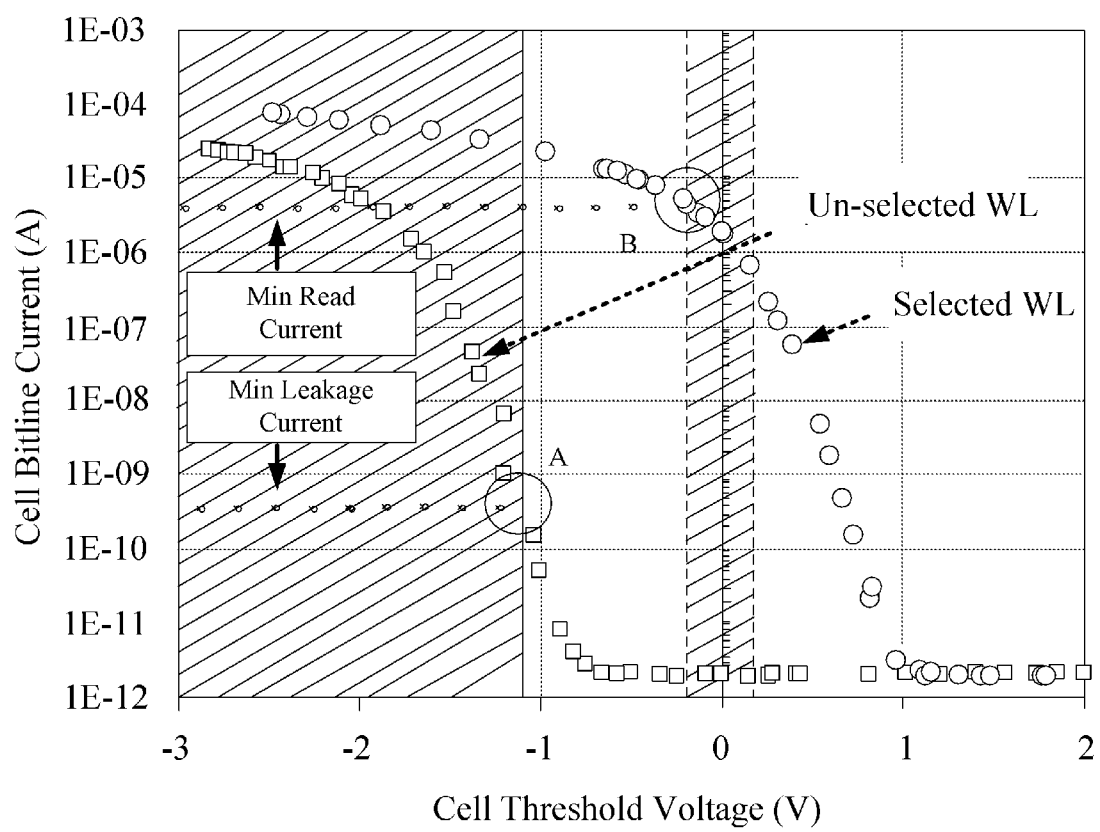
FIGS. 4 and 5 illustrate an example of individual cell current versus the SONOS threshold voltage for selected and un-selected wordlines (WL).
Figure 5:
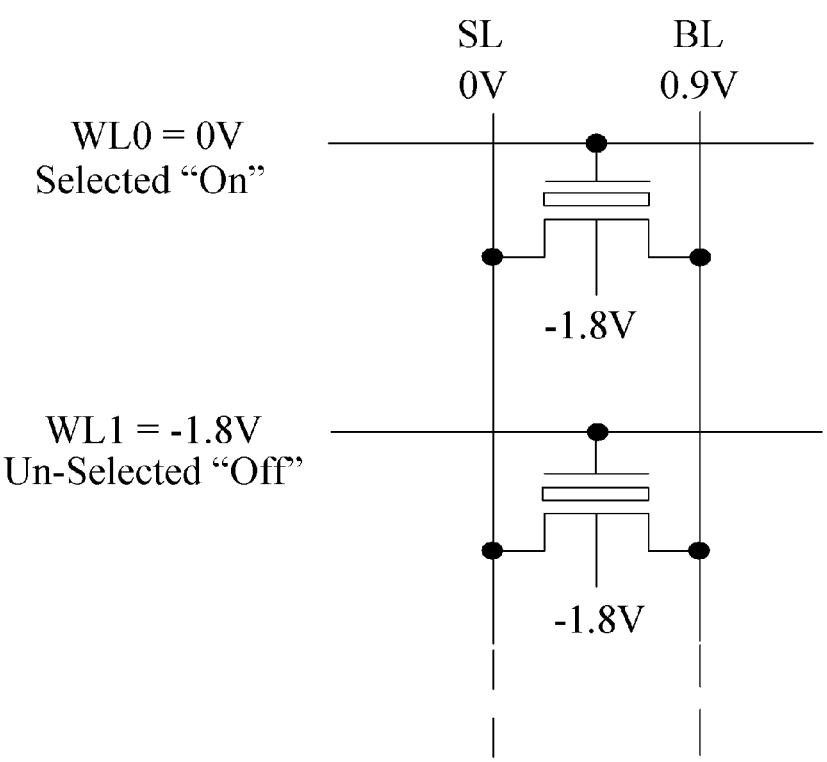

FIGS. 4 and 5 illustrate an example of individual cell current versus the SONOS threshold voltage for selected and un-selected wordlines (WL). The maximum leakage current from the total un-selected cells on the bit line cannot exceed 0.1 uA at 30 C. In this example there are 256 WL's on a bitline, with 255 of them unselected. Therefore the maximum un-selected cell leakage must be <0.1 μA/255=0.392 nA. Thus the un-selected thresholds cannot be more negative than −1.2V indicated by circle A or the leakage current will exceed the maximum value of 0.392 nA. The minimum selected cell read current has to be greater than 4 μA. Thus the maximum cell SONOS threshold cannot be positive than −0.3V as indicated by circle B.

Description of Example Embodiments

The latches setting the BL (bitline) voltages applied to nonvolatile charge storage transistors in a wordline are set to either a program condition or program inhibit condition depending on whether the cell is within a target erase threshold range or not. Therefore, a cell within the target range would have the BL voltage set to a positive voltage (i.e. program-inhibit condition) while the cells on the wordline that are not in the target range have a BL voltage set to a negative voltage (i.e., program condition).

Figure 6:
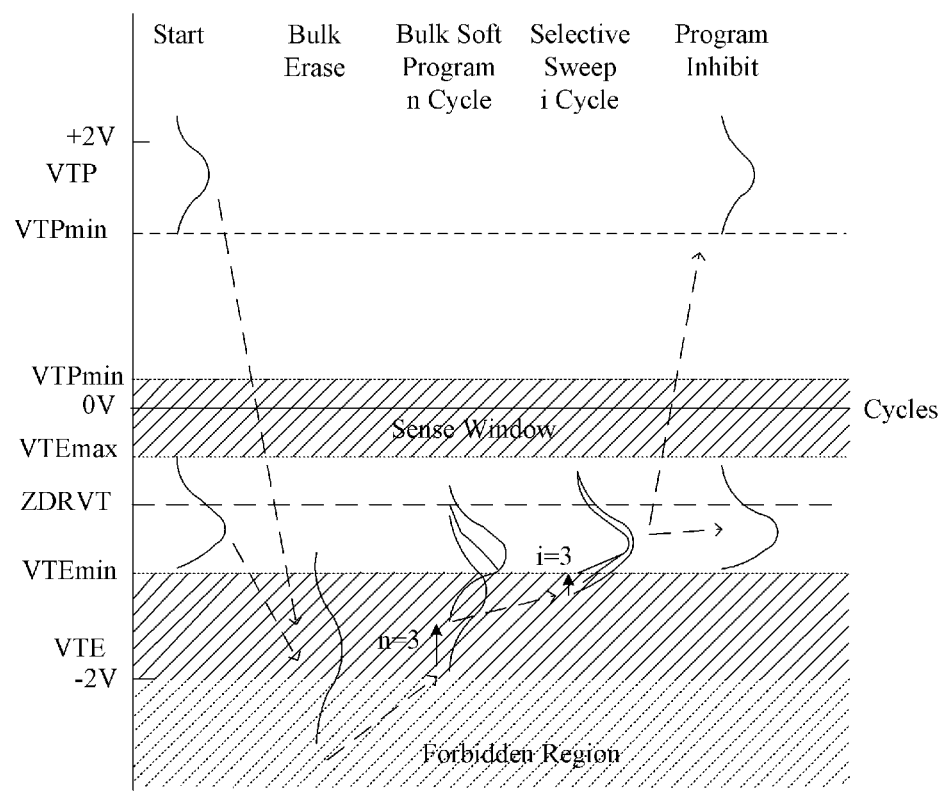
FIGS. 6 and 7 illustrate an example process and circuit for adjustment of cell threshold distributions along a WL.
Figure 7:
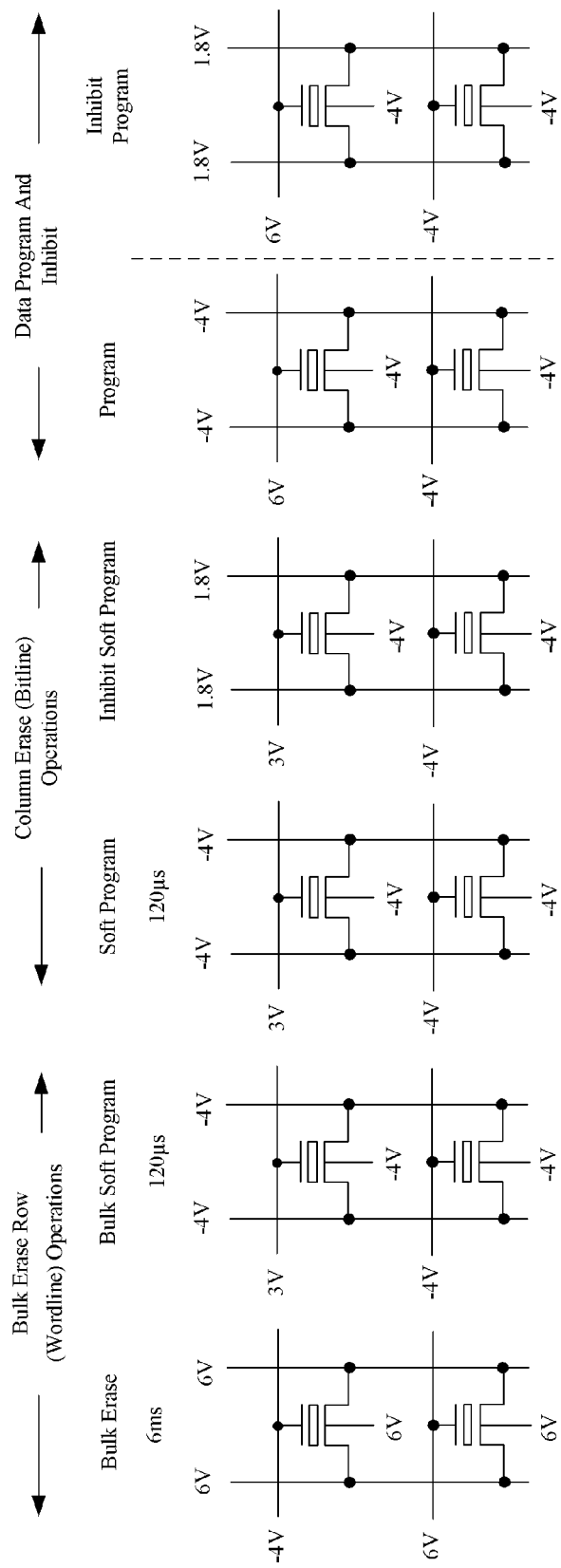

FIG. 6 illustrates an example of adjustment of cell threshold distributions along a WL for 1T SONOS memory cells, for example the configuration of cells illustrated in FIG. 7. Cells on the WL are first bulk erased to about −1.7V. Next a one or more soft program cycles (example n=3) is done to bulk shift the erased distribution closer to the required window between VTEmax and VTEmin. Next any cells with VTE<VTEmin are selectively swept above VTEmin on a column by column basis along the wordline (example i=3). Finally a program/inhibit is performed where some cells are programmed to VTP>VTPmin, and some cells are inhibited from being programmed leaving them in the erase state VTEmax>VTE>VTEmin.

This method may also be applied to floating gate 1T cells and may be especially useful at advanced technology nodes where random dopant fluctuation is dominant. For the floating gate case, in some implementations, VTEmin may be 0V and VTEmax may be 1V. The bulk erase may erase all the bits on the WL to 0V. After that, n=2 soft-program pulses may be applied to bulk shift the erased Vt distribution by ~200 mV. After that, with i=4, pulses, the cells with VTE<VTEMIN are selectively swept above VTEMIN on a column by column basis.

In more detail, the write process described in conjunction with FIGS. 6 and 7 may proceed as follows:
  a. Preprogram the row.
  b. Erase the row, read back data with margin mode word line voltage set to Vtel Target=−0.6V.
  c. Continue erasing until all cells in the row have erase Vts below −0.6V (typically takes 4-5 pulses of 0.5 ms each) until a maximum of 15 erases pulses have been applied.
  d. If 15 erase pulses is not sufficient, another 15 erase pulses can be applied. This can repeat up to 3 times after which the loop exits if the erase Vts are not low enough.
  e. Optional bulk soft program: program all rows with a soft program pulse (100 μs, 8.4V).
  f. Read back data on 1$^{st}$ WL (WL0) with margin mode word line voltage set to Vte=−1.1V.
  g. Change BL voltage of the cells on WL0 which have Vte>−1.1V to program-inhibit condition. Remaining BLs remain in programming condition (i.e. negative voltage on the BL).
  h. Continue soft programming pulses until all erase Vts are above −1.1V (typically takes 1-2 soft program pulses of 100 μs). For each additional soft program pulse, the pulse voltage is incremented (for example) by 200 mV. Some implementations may vary the time interval that the soft program pulses are applied and maintain a constant voltage for each pulse instead. In general, one or both of the soft program voltage level and soft program voltage interval may be modulated between soft program cycles. In some implementations, the pulse time interval may be 50 us or 250 us and the several pulses may be applied with a constant voltage. In other implementations, the pulse voltage may be incremented by 100 mV for every pulse. In an exemplary implementation, the pulse time may be 100 us and 3 pulses may be applied with the same pulse voltage. After these three pulses, the pulse voltage may be incremented by 150 mV and 3 more pulses may be applied. This process may then repeat until the target is reached or the maximum erase time (or pulse voltage) is reached or exceeded.
  i. A maximum of 10 soft program pulses are applied. If Vte is not achieved in 10 soft program pulses, the routine exits. The device will FAIL because the program cycle of the write has not yet occurred.
  j. Repeat this process on every WL, until all desired WLs are done. This may be for example 256 WLs in a sector or the full chip which may have 1024 or more WLs.
  k. Program the data with a program pulse of 2 ms at 10.7V.

The write time per row is variable, since up to 45 erase pulses of 0.5 ms can be applied, and up to 10 soft-program pulses of 100 microseconds. However; multiple loops of erase only occur on virgin die, where the erase thresholds are indeterminate and highly variable. In such cases write times>20 ms have been observed, and up to 3 writes may need to be executed before the Vte is successfully ranged. Once it is successful, all subsequent writes complete in less 10 ms. A typical execution of the process may complete in about 7 ms. For wafer sort purposes, either sort trim or bulk smart write can be implemented to reduce test time.

These voltages and times are examples and not limiting. For instance in other technologies, the programming voltage and erase voltage may be 7.5V and in that case the soft-programming voltage may be 5V.

Figure 8:
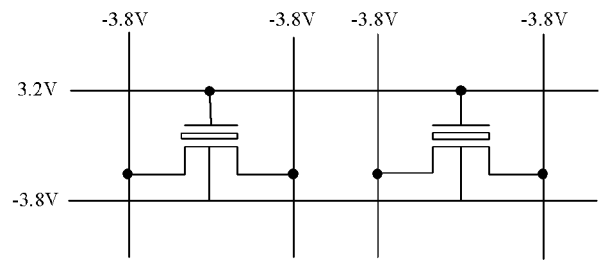
FIGS. 8 and 9 illustrate an embodiment of a threshold voltage adjustment process for SONOS transistors in a memory array.
Figure 8:
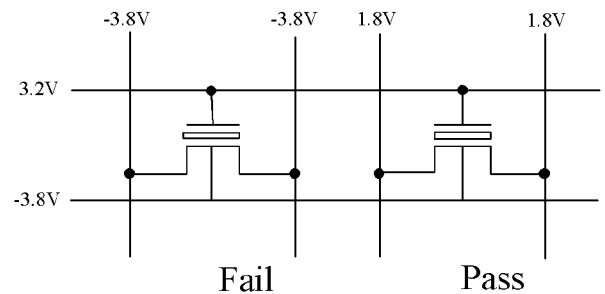
Figure 8:
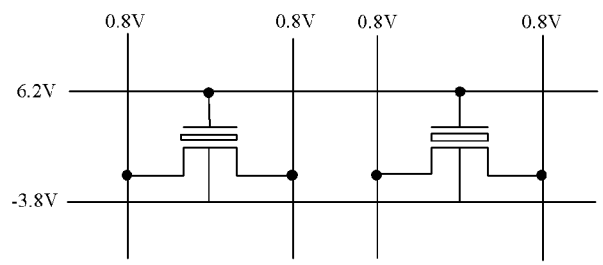
Figure 9:
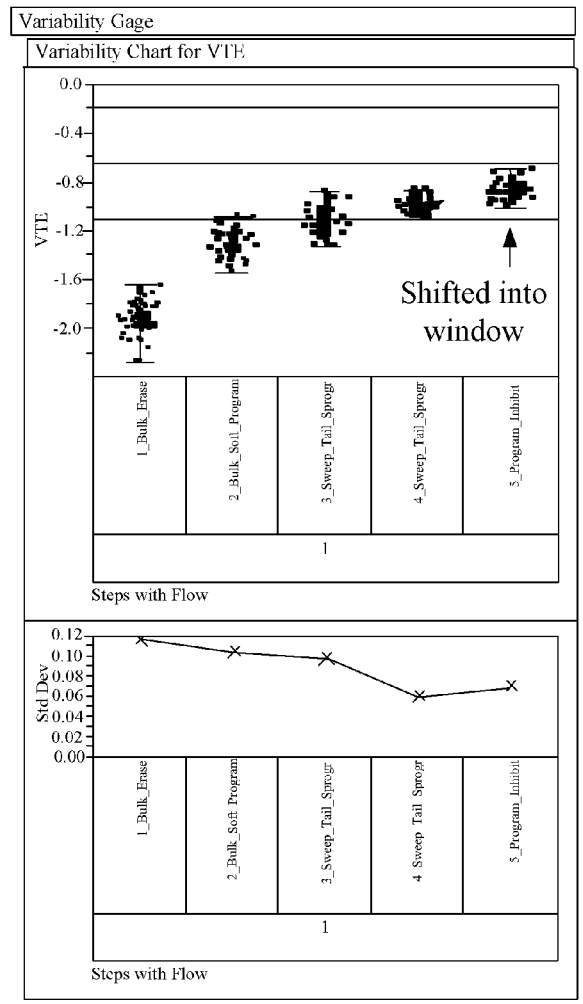

FIGS. 8 and 9 illustrate a second embodiment of a threshold voltage adjustment process and circuit for SONOS transistors in a memory array. The process steps are similar to those described in conjunction with FIGS. 6 and 7, with potentially some differences in the details of individual steps.

Figure 10:
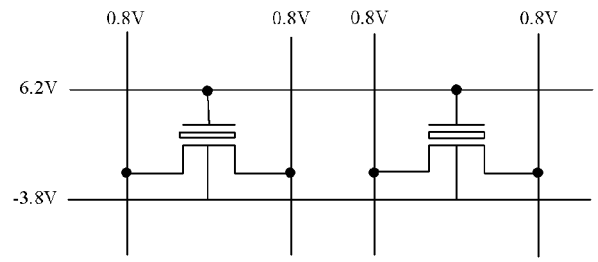
FIGS. 10 and 11 illustrate a third embodiment of a threshold voltage adjustment process for SONOS transistors in a memory array.
Figure 10:
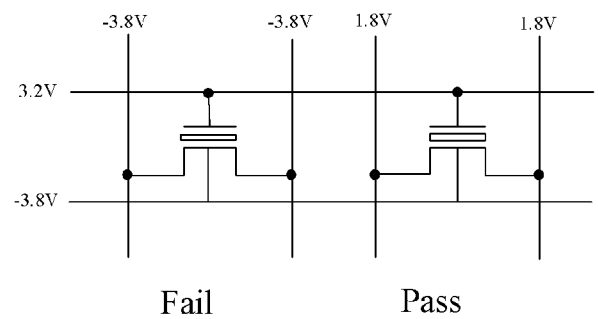
Figure 11:
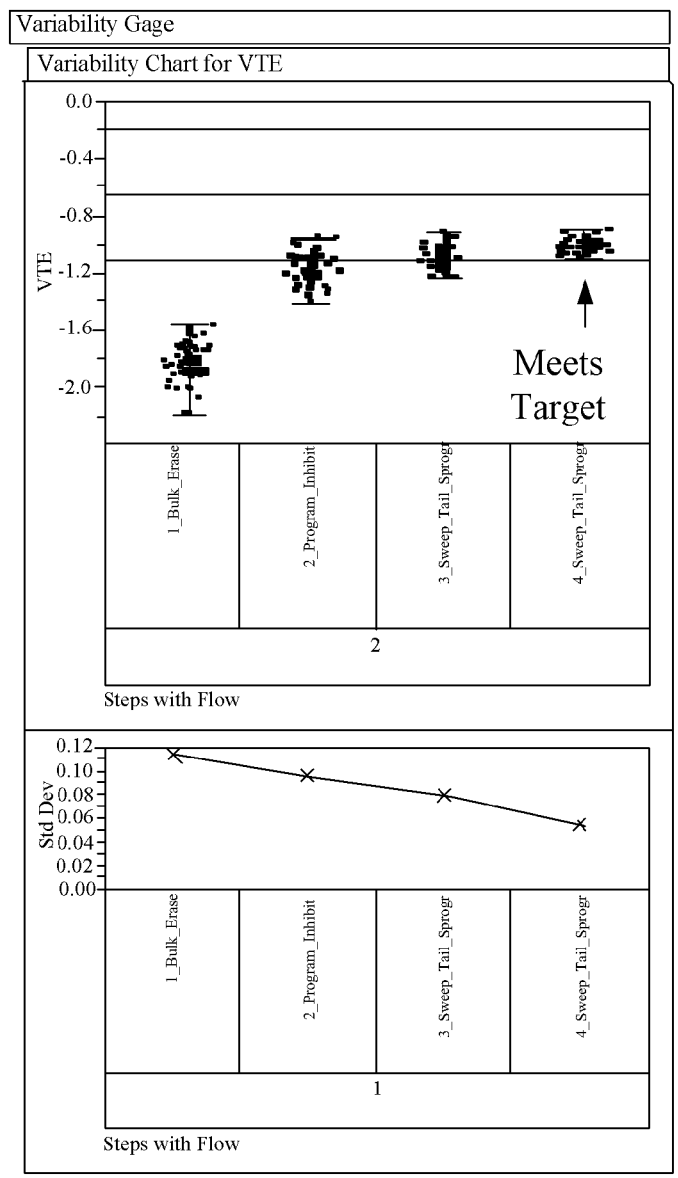

FIGS. 10 and 11 illustrate a third embodiment of a threshold voltage adjustment process for SONOS transistors in a memory array. The process steps are similar to those described in conjunction with FIGS. 6 and 7, with potentially some differences in the details of individual steps.

Figure 12:
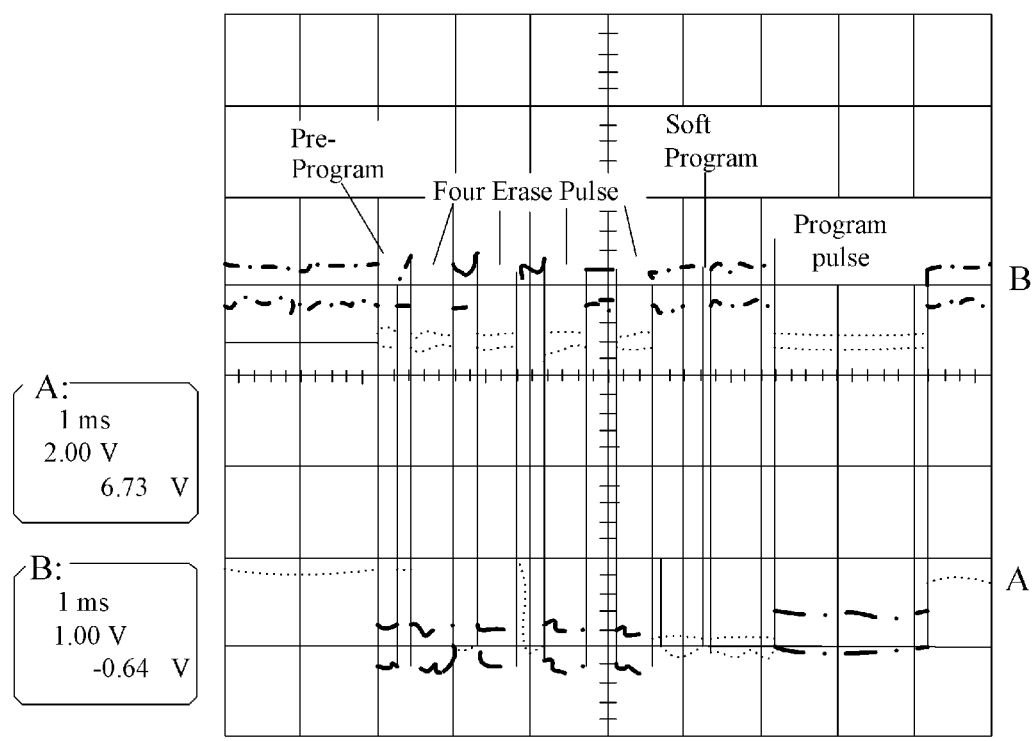
FIG. 12 illustrates exemplary pulse sequences for a threshold voltage adjustment process in accordance with the embodiments described herein.

FIG. 12 illustrates exemplary pulse sequences for a threshold voltage adjustment process in accordance with the embodiments described herein. In the graph, B=Vneg@1V/div, A=Vpos@2V/div., horizontal=1 ms/div.

Figure 13:
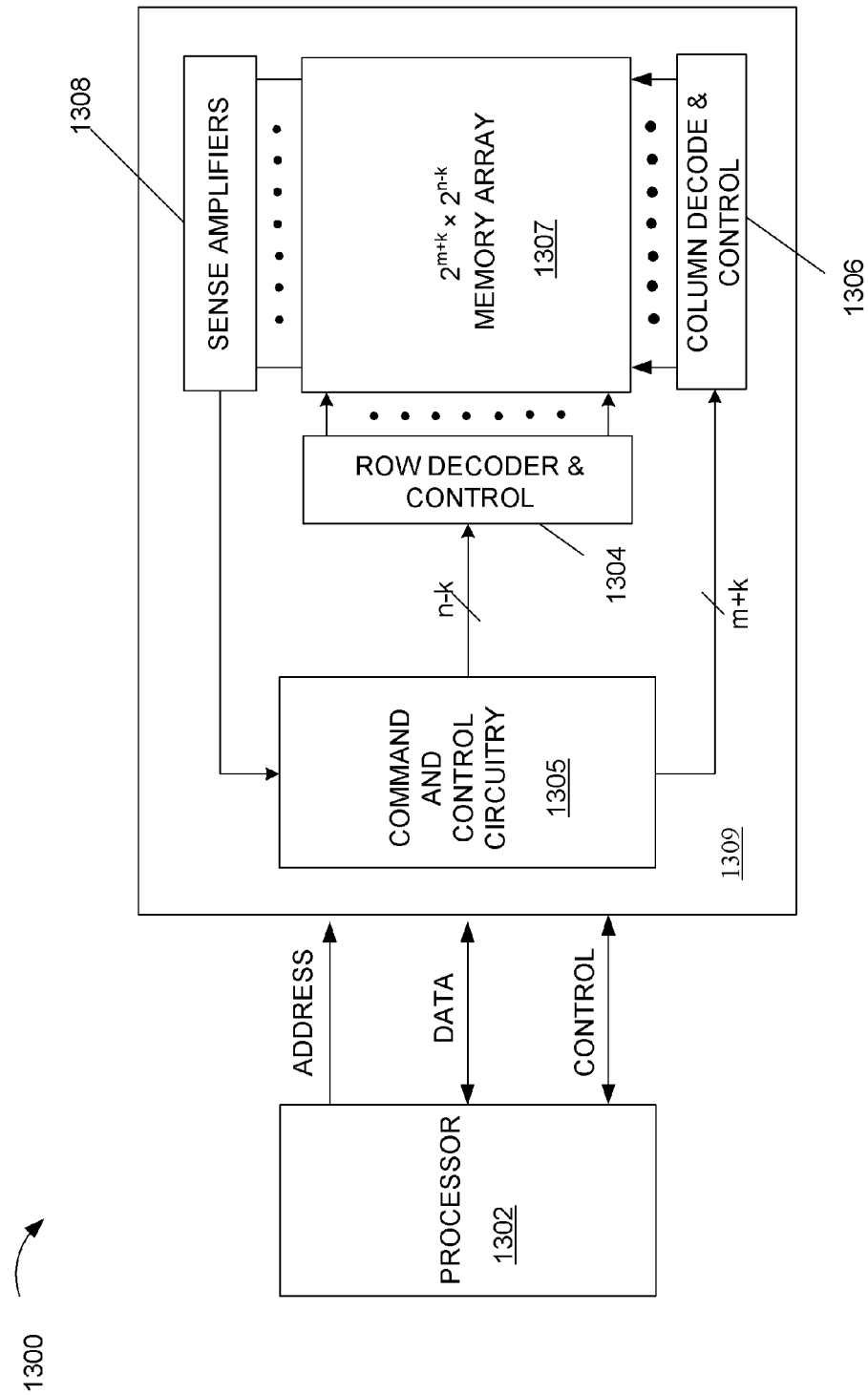
FIG. 13 illustrates an example of a machine comprising an embodiment of a machine memory system.

FIG. 13 illustrates an example of a machine comprising an embodiment of a machine memory system. The machine 1300 includes a processor 1302 that reads and writes data from and to a memory system 1309. The memory system 1309 includes control circuitry (logic) 1305 that carries out actions of the techniques described herein, including bulk erase, bulk soft program, program, and program inhibit. Soft programming on a cell-by-cell basis may be accomplished by the controller 1305 reading the threshold erase voltage of individual cells via the sense amplifiers 1308. Generally, this may be accomplished by setting the gate voltage of the flash device (SONOS or floating gate) at the target Vt and then using the sense amplifier to detect "1" or "0" with a slow read cycle. A row (wordline) of the memory array 1307 is selected by row decoder 1304. Particular memory cells of the row are programmed by the controller 1305 operating the column control logic 1306 to set the appropriate voltages applied to the memory cells along the word line to either soft program settings or program inhibit settings, on a cell-by-cell basis along the row.

Implementations and Alternatives

The techniques and procedures described herein may be implemented via logic distributed in one or more computing devices. The particular distribution and choice of logic is a design decision that will vary according to implementation.

Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. read/write volatile or nonvolatile memory or media). "Firmware" refers to logic embodied as read-only memories and/or media. Hardware refers to logic embodied as analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory.

In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), circuitry forming a memory device (e.g., forms of random access memory), and/or circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A method comprising:
selectively increasing a threshold voltage of particular ones of a plurality of nonvolatile memory cells on a same word line, on a cell by cell basis, by performing a selective soft-program on a first subset of the cells simultaneously with a program inhibit on a second subset of the cells;
reading back data from one or more of the cells with a margin mode word line voltage set to a target threshold voltage for the cells; and
repeating the selective soft-program until the threshold voltage of each of the cells falls between a minimum acceptable value and a maximum acceptable value.

2. The method of claim 1, further comprising:
progressively increasing a soft program pulse interval between repetitions of the selective soft program of the first subset of the cells.

3. The method of claim 1, further comprising:
repeatedly erasing cells in the word line until each one has a threshold voltage below the target threshold voltage, or until a maximum number of erases have been applied.

4. The method of claim 1, further comprising:
after soft programming the cells, reading back data from the cells with a margin mode word line voltage set to a value more negative than the target threshold voltage.

5. The method of claim 1, further comprising:
progressively incrementing a soft program pulse voltage level between repetitions of the selective soft program of the first subset of the cells.

6. A nonvolatile machine memory circuit, comprising:
a plurality of memory cells; and
logic to
selectively increase a threshold voltage of a first subset of the cells on a word line on a cell by cell basis by performing a selective soft program on the first subset of the cells, while simultaneously performing a program inhibit on a second subset of the cells, read back data from one or more of the cells with a margin mode word line voltage set to a target threshold voltage for the cells, and repeat the selective soft program on the first subset of cells until the threshold voltage of each of the cells in the word line falls between a minimum acceptable value and a maximum acceptable value.

7. The memory circuit of claim 6, further comprising logic to change a soft program pulse voltage level between repetitions of the soft program of the first subset of cells.

8. The memory circuit of claim 6, further comprising logic to, after bulk erasing the cells on the word line, read back data from the cells with margin mode word line voltage set to the target threshold voltage for the cells.

9. The memory circuit of claim 6, further comprising logic to repeatedly erase cells in the word line until each one has a threshold voltage below the target threshold voltage, or until a maximum number of erases have been applied.

10. The memory circuit of claim 6, further comprising logic to, after soft programming the cells, read back data from the cells with margin mode word line voltage set to a value more negative than a target threshold voltage.

11. The memory circuit of claim 6, further comprising logic to change a soft program pulse voltage level between repetitions of the soft program of the first subset of cells.

12. A method comprising:
selectively increasing a threshold voltage of particular non-volatile memory cells on a same word line, on a cell by cell basis, by repeatedly performing a selective soft-program on a first subset of the cells simultaneously with a program inhibit on a second subset of the cells on the same wordline;
changing one or both of a soft program voltage level and a soft program interval between repetitions of the soft-program of the first subset of the cells;

reading back data from the cells with margin mode word line voltage set to a value more negative than a target threshold voltage; and repeating the selective soft program until all of the cells have a threshold voltage that falls between a minimum acceptable value and a maximum acceptable value.

13. The method of claim 12, further comprising:
pre-programming the cells on the word line before bulk erasing.

14. The method of claim 12, further comprising:
bulk soft-programming all of the cells on the word line prior to selectively soft-programming the first subset of the cells.

15. The method of claim 12, further comprising:
after bulk erasing the cells on the word line, reading back data from the cells with margin mode word line voltage set to the target threshold voltage for the cells.

16. The method of claim 15, further comprising:
repeatedly erasing cells in the word line until each one has a threshold voltage below the target threshold voltage, or until a maximum number of erases have been applied.

17. The method of claim 12, further comprising:
after soft programming the cells, reading back data from the cells with margin mode word line voltage set to a value more negative than a target threshold voltage.

18. The method of claim 12, further comprising:
progressively increasing a soft program pulse voltage level between repetitions of the selective soft program of the first subset of the cells.

19. The method of claim 12, further comprising:
progressively increasing a soft program pulse interval between repetitions of the selective soft program of the first subset of the cells.

* * * * *